United States Patent
Ware (10) Patent No.: US 8,756,481 B2
(45) Date of Patent: *Jun. 17, 2014

(54) MULTIPLE-LEVEL MEMORY CELLS AND ERROR DETECTION

(71) Applicant: Micron Technology, Inc., Boise, ID (US)

(72) Inventor: Kurt Ware, Vadnais Heights, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/757,358

(22) Filed: Feb. 1, 2013

(65) Prior Publication Data

US 2013/0151931 A1 Jun. 13, 2013

Related U.S. Application Data

(63) Continuation of application No. 12/425,139, filed on Apr. 16, 2009, now Pat. No. 8,370,709.

(51) Int. Cl.
*H03M 13/00* (2006.01)

(52) U.S. Cl.
USPC .......................................................... 714/763

(58) Field of Classification Search
USPC .......... 714/30, 31, 39, 42, 47.2, 54, 718, 719, 714/721, 758–760, 763, 764, 766–768
See application file for complete search history.

(56) References Cited

U.S. PATENT DOCUMENTS

| | | | |
|---|---|---|---|
| 7,133,311 B2 | 11/2006 | Liu | |
| 7,844,879 B2 * | 11/2010 | Ramamoorthy et al. | 714/763 |
| 7,966,547 B2 * | 6/2011 | Lam | 714/773 |
| 8,055,988 B2 * | 11/2011 | Lam | 714/803 |
| 2007/0171714 A1 * | 7/2007 | Wu et al. | 365/185.09 |
| 2007/0277060 A1 * | 11/2007 | Cornwell et al. | 714/54 |
| 2008/0313525 A1 * | 12/2008 | Baker | 714/758 |
| 2010/0269016 A1 | 10/2010 | Ware | |

OTHER PUBLICATIONS

"An overview of BCH codes", [online] downloaded at: http://en.wikipedia.org/wiki/BCH_code, (Accessed Jun. 22, 2011), 7 pgs.
"An overview of finite fields", [online] Downloaded at: http://en.wikipedia.org/wiki/Finite_field, (Accessed Jun. 22, 2011), 9 pgs.
"An overview of Reed-Solomon codes", [online] Downloaded at: http://en.wikipedia.org/wiki/Reed-Solomon_error_correction, (Accessed Aug. 24, 2012), 15 pgs.
"Description of Gray codes", [online] Downloaded at: http://en.wikipedia.org/wiki/Gray-code, (Accessed on Jun. 22, 2011), 1 pg.
"Figure 1 is slide 18", [online] Downloaded at: http://spweb/sites/MPGPENAND/Shared%20Docs1/NAND%20Reliability%20Class.ppt.

(Continued)

*Primary Examiner* — Nadeem Iqbal
(74) *Attorney, Agent, or Firm* — Schwegman, Lundberg & Woessner, P.A.

(57) ABSTRACT

Memory, modules and methods for using error detection with multi-level memory cells where the number of storage levels of the memory cells is an integer power of a non-binary prime number are provided. Additional circuit and methods are disclosed.

20 Claims, 10 Drawing Sheets

(56) References Cited

OTHER PUBLICATIONS

Chang, Hsie-Chia, et al., "Multi-level memory systems using error control codes", Proceedings of the 2004 International Symposium on Circuits and Systems, 2004. ISCAS '04, vol. 2, (2004), II-393-II-396.

Nobukata, H, et al., "A 144 Mb 8-level NAND flash memory with optimized pulse width programming", 1999 Symposium on VLSI Circuits, 1999. Digest of Technical Papers., (1999), 39-40.

Shibata, N, et al., "A 70 nm 16 Gb 16-Level-Cell NAND flash Memory", IEEE Journal of Solid-State Circuits, 43(4), (Apr. 2008), 929-937.

* cited by examiner

| NUMBER OF LEVELS PER CELL | NUMBER OF PAYLOAD CELLS | ACCEPTABLE VALUES FOR t AND a | FINITE FIELD USED | NUMBER OF CELLS NEEDED FOR ECC DATA | ECC OVERHEAD |
|---|---|---|---|---|---|
| 2 | 8192 | $t=2, a=10^{-9}$ | $GF(2^{14})$ | 28 | 0.3% |
| 4 | 4096 | $t=4, a=2.1 \times 10^{-7}$ | $GF(2^{14})$ | 28 | 0.7% |
| 8 | 2731 | $t=6, a=4.6 \times 10^{-6}$ | $GF(2^{14})$ | 28 | 1.0% |
| 3 | 5169 | $t=3, a=2.1 \times 10^{-8}$ | $GF(3^9)$ | 27 | 0.5% |
| 5 | 3529 | $t=4, a=2.1 \times 10^{-7}$ | $GF(5^6)$ | 24 | 0.7% |
| 7 | 2919 | $t=5, a=2.1 \times 10^{-6}$ | $GF(7^5)$ | 25 | 0.9% |
| 9 | 2586 | $t=6, a=4.6 \times 10^{-6}$ | $GF(3^9)$ | 27 | 1.0% |

710 MODULO 2

| + | 0 | 1 |
|---|---|---|
| 0 | 0 | 1 |
| 1 | 1 | 0 |

730 MODULO 3

| + | 0 | 1 | 2 |
|---|---|---|---|
| 0 | 0 | 1 | 2 |
| 1 | 1 | 2 | 0 |
| 2 | 2 | 0 | 1 |

720 MODULO 2

| x | 0 | 1 |
|---|---|---|
| 0 | 0 | 0 |
| 1 | 0 | 1 |

740 MODULO 3

| x | 0 | 1 | 2 |
|---|---|---|---|
| 0 | 0 | 0 | 0 |
| 1 | 0 | 1 | 2 |
| 2 | 0 | 2 | 1 |

750

| MODULO 3 | BINARY DIGITS |
|---|---|
| 0 | 00 |
| 1 | 01 |
| 2 | 10 |
| NOT USED | 11 |

760 MODULO 3

| + | 00 | 01 | 10 | 11 |
|---|---|---|---|---|
| 00 | 00 | 01 | 10 | XX |
| 01 | 01 | 10 | 00 | XX |
| 10 | 10 | 00 | 01 | XX |
| 11 | XX | XX | XX | XX |

770 MODULO 3

| x | 00 | 01 | 10 | 11 |
|---|---|---|---|---|
| 00 | 00 | 00 | 00 | XX |
| 01 | 00 | 01 | 10 | XX |
| 10 | 00 | 10 | 01 | XX |
| 11 | XX | XX | XX | XX |

MULTIPLE-LEVEL MEMORY CELLS AND ERROR DETECTION

PRIORITY APPLICATION

This application is a continuation of U.S. application Ser. No. 12/425,139, filed Apr. 16, 2009, which is incorporated herein by reference in its entirety.

BACKGROUND

The trend in memory systems is to provide high-density memory arrays with increasing data reliability. One way to increase memory density is to store more information within each memory cell. Memory systems based on multi-level memory cells provide the opportunity to store more than one bit of data in each memory cell. Memory systems may be implemented in a single chip, a multi-chip package, or multiple packaged chips, where each chip may comprise a number of multilevel memory cells.

BRIEF DESCRIPTION OF THE DRAWINGS

Some embodiments of the disclosed technology are illustrated by way of example and not limitation in the figures of the accompanying drawings in which.

DETAILED DESCRIPTION

Example methods and circuits for integrating error detection with multi-level memory cells will be described. In the following description for the purpose of explanation, numerous examples having example-specific details are set forth to provide an understanding of example embodiments. It will be evident, however, to one skilled in the art that the present examples may be practiced without these example-specific details, and/or with different combinations of the details than are given here.

Some example embodiments described herein may include adjusting error detection operations in relation to a write operation of data into a multi-level memory cell. The multi-level memory cell may comprise multiple storage levels (e.g., voltage levels in semiconductor memories, magnetic flux levels in disk drives and ferro-electric memories, or phases of a material in phase change memories, etc.). The number of multiple storage levels may include a non-binary prime number. The logic module may detect and correct errors in read data during a successive read operation of the data from the multi-level memory cell.

Example methods may include providing multi-level memory cells, where a base-p logarithm of the number of the multiple storage levels is an integer greater than zero where p is a non-binary prime number (e.g., 3, 5, 7, 9, etc.). In other words, the number of multiple storage levels may be represented by $p^m$, where m is an integer greater than zero and p is a non-binary prime number. The benefits of using $p^m$ storage level memory cells with p being a non-binary prime number, as compared to the traditional $2^j$ storage level memory cells, will become apparent from the discussion below.

Determining the number of storage levels for memory cells in a memory system may be useful because increasing the number of storage levels allows storing of more data bits in each cell, and therefore, increasing storage capacity on a fixed area of a chip, resulting in higher density chips with lower cost per stored bit. However, as discussed below, some reliability issues may impose an upper limit on the number of storage levels considered for each memory cell.

Figure 1:
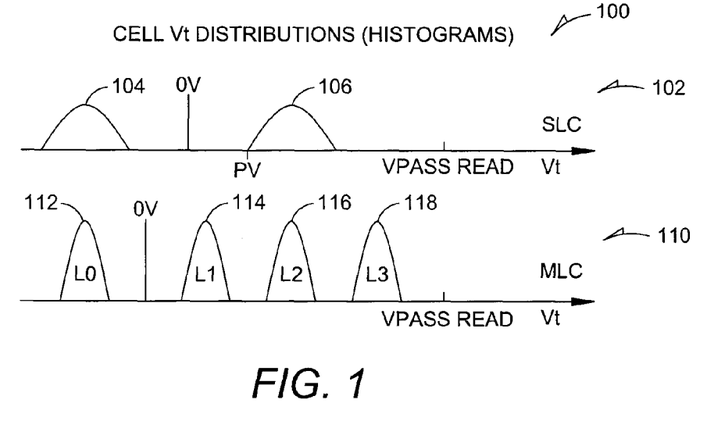
FIG. 1 is a diagram illustrating example threshold voltage distribution of single-level and multi-level memory cells.

For example, FIG. 1 is a diagram 100 illustrating threshold voltage Distributions of single-level and multi-level memory cells, according to various embodiments of the invention. In the example embodiments shown in FIG. 1, each storage level may correspond to a threshold voltage ($V_t$) range associated with an input transistor of a memory cell of a memory device (e.g., a NAND flash device). A diagram 102 shows threshold voltage distributions for single-level cells (SLCs). A $V_t$ distribution 104 located in the negative threshold voltage region may represent erased memory cells, whereas the $V_t$ distribution 106 located in the positive threshold voltage region may be associated with programmed memory cells having a threshold voltage greater than zero.

A diagram 110 shows threshold voltage distributions for multi-level memory cells (MLCs), where the $V_t$ distributions 112, 114, 116, and 118 represent four different levels labeled L0, L1, L2, and L3. The $V_t$ distributions shown in FIG. 1 may represent statistical distributions of the measured threshold voltages for a large number of memory cell transistors. For example, in a multi-level cell NAND flash device, one may store two binary digits in a single memory cell by changing the amount of charge on the transistor's floating gate. The L0-L3 voltage levels may be assigned to the binary digital values 00, 01, 11, and 10.

For historical reasons, memory systems have been using $2^j$ storage levels in multilevel memory cells. During a write operation, for example, a digital to analog converter may convert j binary digits to a particular analog voltage signal representing a memory cell threshold voltage. Also, a given threshold voltage signal associated with a programmed memory cell may undergo an analog-to-digital conversion during a successive read operation to regenerate the original j binary digits. For example, in a dynamic random access memory (DRAM), a similar method may be used to store j binary digits on a cell capacitor with $2^j$ voltage levels.

In a more general case considered in this application, a memory cell may be designed with $p^m$ storage levels where p is a prime number and m is an integer greater than 0. This would provide more opportunities for increasing the number of storage levels per memory cell. For example, storing 8192 bits of data in a SLC uses 8192 memory cells, whereas storing the same number of bits in a 5 or 7-storage level MLC uses only 3259 or 2919 memory cells, respectively.

In a traditional approach of $2^j$ voltage levels (e.g., 2, 4, 8, 16, etc.) the next two choices for the number of voltage levels to be considered, for example after 4, are 8 and 16, which may not be plausible due to some implementation limitations. As a matter of contrast, in the proposed approach of using $p^m$ storage levels (e.g. 3, 5, 7, 9, etc.), the options of 5, 7, 9, etc. for the number of voltage levels are also available for the designer to consider.

When increasing the number of storage levels in a memory cell, other design considerations, for example data reliability, may come into play. As the number of storage levels in a memory cell increase, due to limitations in applying higher voltages, the distance between $V_t$ distributions shown in FIG. 1 may decrease. As a result, the memory cell might be more prone to corruption mechanisms.

Figure 2:
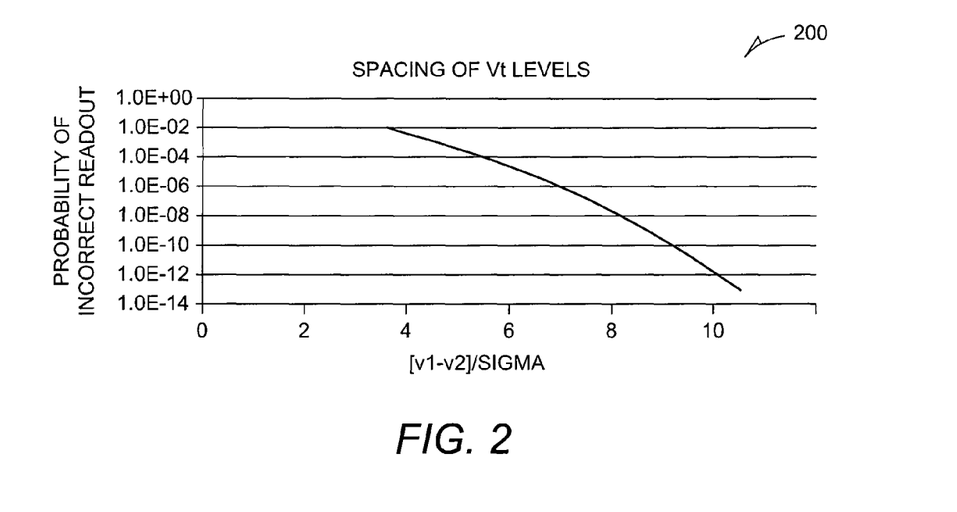
FIG. 2 is a graph depicting the probability of incorrect readout as a function of distance between memory cell voltage levels, as shown in FIG. 1.

For example, FIG. 2 is a graph 200 depicting the probability of incorrect readout as a function of distance between memory cell voltage levels, as shown in FIG. 1. The graph shows that as the number of voltage levels in a memory cell increases, which results in less distance between $V_t$ distributions (e.g., 114 and 116, in FIG. 1 and effectively between threshold voltages $V_1$ and $V_2$ in FIG. 2), the probability of incorrect readout increases approximately according to 1−erf ($|V_1-V_2|/2\sigma$), where erf( ) and $\sigma$ denote the error function and standard deviation of the $V_t$ distributions (e.g., 114 and 116, in FIG. 1).

Common corruption mechanisms in NAND flash memories may include thermal noise, random telegraph signaling (also known as burst noise), wear out from many program/erase cycles, and disturbances due to read and write of adjacent cells. In DRAM memories, corruption mechanisms may include thermal noise, charge leakage, latent manufacturing defects, and disturbances due to write and read of adjacent cells. Digital error correction and detection may be used to overcome the reliability issues resulting from the corruption mechanisms mentioned above, among others.

Extra memory cells may be considered within a memory array to store metadata and check symbols. The check symbols may be used to detect and correct errors in the data read from the memory cells. For example, the memory device may include 4224 bytes per actual page, which may store 4096 bytes of payload data.

A common method used for digital error detection and correction is the BCH (named after its inventors: Bose, Ray-Chaudhuri, and Hocquenghem) algorithm (also referred to as code), as explained in "Error Control Coding: Fundamentals and Applications", by Shu Lin and Daniel J Costello, Prentice-Hall, Copyright 2004, and other references. As is well-known to those of ordinary skill in the art, the BCH algorithm is based on finite field algebra methods using $p^m$ elements, where p is a prime number and m is an integer greater than zero. In the more common binary BCH algorithm with p=2, the notation GF(2) denotes a finite field (also known as a Galois Field) with two ground field elements, 0 and 1.

Non-binary BCH algorithms also exist, using p=3, 5, 7, 11, 13 and so on. For example, GF(3) is used to denote a finite field with three elements (0, 1 and $\alpha$) and GF(5) is used to denote a finite field with five elements (0, 1 $\alpha$, $\alpha^2$ and $\alpha^3$). Finite field arithmetic for these non-binary cases may still be implemented using digital logic, where binary digital numbers 000, 100, 001, 101, and 110 may be used to represent the five elements 0, 1 $\alpha$, $\alpha^2$ and $\alpha^3$ of the GF(5) finite field. The binary digital representations may be chosen so that the logic complexity of finite field arithmetic operations is a minimum. This can result in better use of the chip area occupied by functions such as addition and multiplication performing circuits.

Returning to the discussion of memory storage levels and error detection and correction, the GF(5) finite field may, for example, be a candidate representation for a 5-level memory cell (e.g., a memory cell with 5 storage levels). In this representation, to store binary digital number 100 or 101 in the 5-level memory cell, voltage values corresponding to the first two positive levels, may be applied to the 5-level memory cell. It should be noted that the additional capacity provided by using multi-level memory cells may be utilized for storing check symbols, which may be used in the error detection and correction process.

Assuming that the memory cells in a memory array are independent of each other, one may estimate the probability that more than t errors will occur within a sector having n memory cells using the formula $AER(t) \approx (na)^t/(t+1)!$, where a is a probability of error for an individual memory cell, and AER stands for Application Error Rate. The expression for AER(t) cannot be inverted in closed form, but given n and t, one may infer values of a that maintain an expected AER value by forward calculation.

Figure 3:
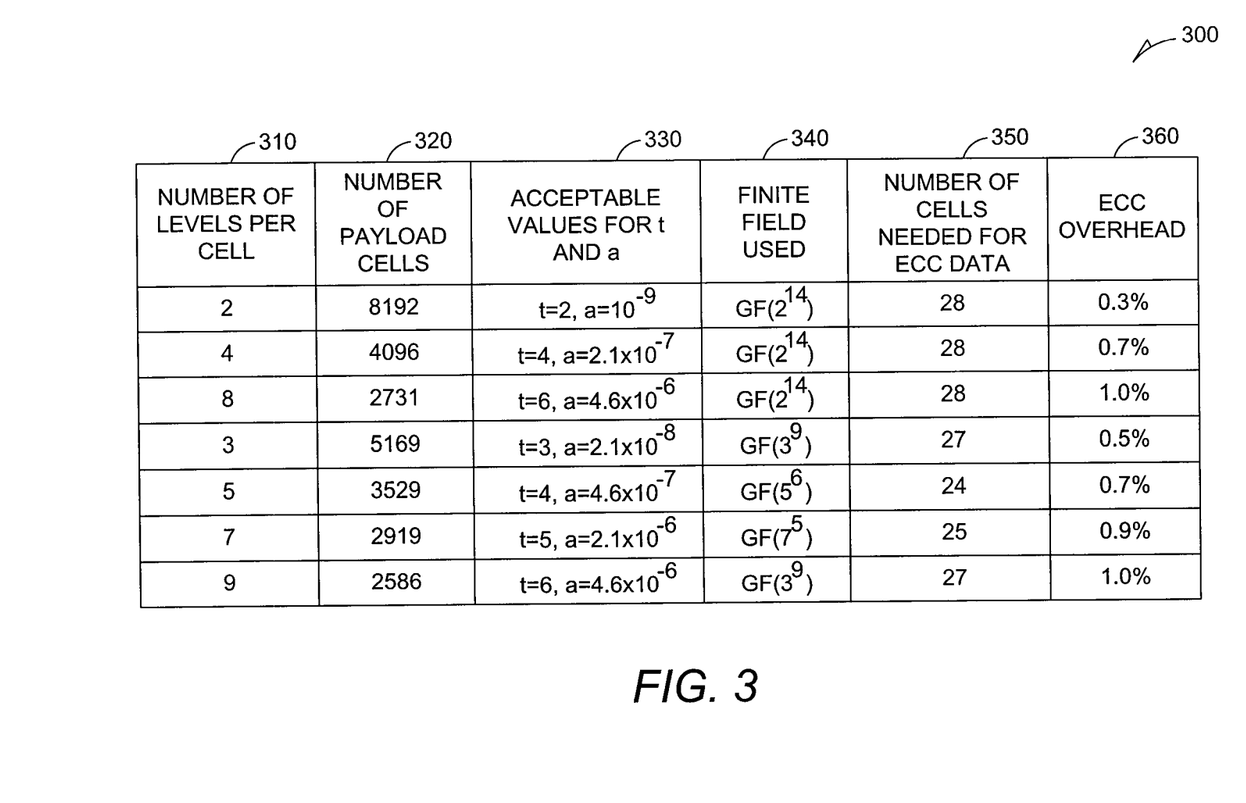
FIG. 3 is a table illustrating example error detection operations for multi-level memory cells, according to various embodiments of the invention.

For example, FIG. 3 is a Table 300 illustrating example error detection operations for multilevel memory cells, according to various embodiments of the invention. Table 300 may provide an insight into the effect of increasing the number of storage levels per memory cell (column 310) on the error correction code (ECC) overhead (column 360). The ECC overhead is calculated by dividing the number of cells needed for ECC data (column 350) by the number of payload cells (column 320) for each respective number of levels per cell (column 310). The number of payload cells (column 320) indicates the number of memory cells that can store 8192 bits of payload data. Acceptable values for t and a given in column 330 are determined based on an assumed AER value of $10^{-16}$, using the expression for AER(t). The number of cells needed for ECC data (column 350) is calculated based on the finite fields (column 340).

The benefit of using a non-binary number of storage levels (e.g., 3, 5, 7, and 9), as compared to a binary number of storage levels (e.g., 2, 4, and 8 shown in the first three rows of Table 300) may be observed. For example, for a 4-level memory cell (where the number of storage levels per cell is 4) the ECC overhead (column 360) is 0.7%, whereas for a 5-level memory cell the corresponding ECC overhead (column 360) is still 0.7%. Similarly, a 9-level memory cell is shown to have the same ECC overhead (1%) as an 8-level memory cell, demonstrating how a non-binary number (e.g., 3, 5, 7, 9, etc.) of storage levels may be more beneficial in terms of ECC overhead, by providing higher storage capacity (more storage levels per memory cell) at a comparable ECC overhead.

Figure 4:
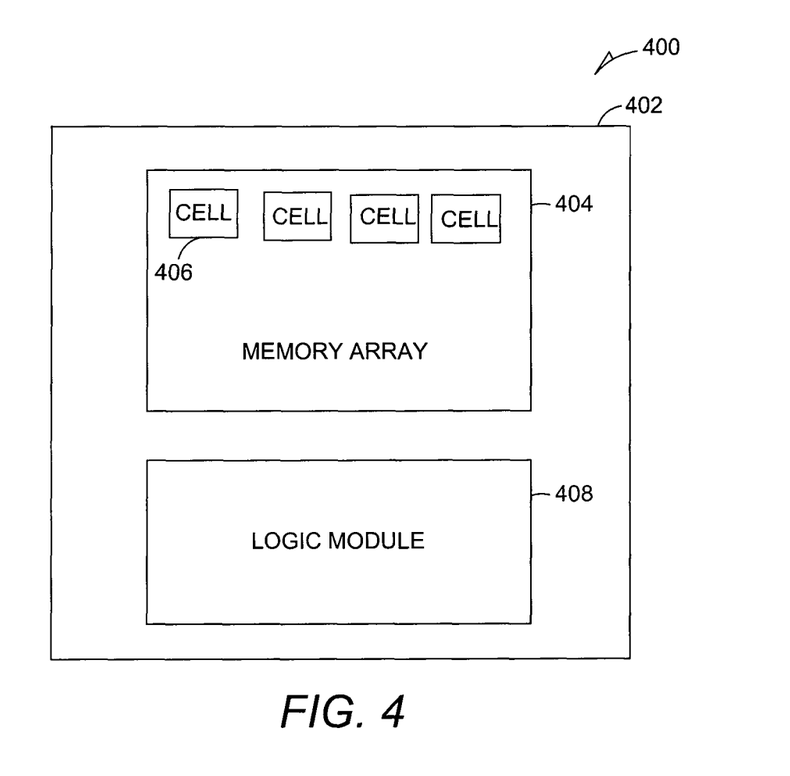
FIG. 4 is a block diagram illustrating an example of a circuit for integrating error detection with multi-level memory cells, according to various embodiments of the invention.

For example, FIG. 4 is a block diagram 400 illustrating an example of a circuit 402 for integrating error detection with multiple level memory cells, according to various embodiments of the invention. As shown in FIG. 4, the circuit 402 may comprise a memory array 404 and a logic module 408. The memory array 404 may manufactured by forming a NAND flash memory, a DRAM, a static RAM (SRAM), or any other memory technology capable of using a multiple-level cell format. The memory array 404 may comprise a number of memory cells 406. Each memory cell 406 may store one or more bits of data. The data may include payload data and check symbols (e.g., check bits). The number of stored bits may be determined by the number of the multiple storage levels within each memory cell 406. In an example embodiment, the number of storage levels may be a non-binary number (e.g., 3, 5, 7, 9, etc.) that does not conform to the $2^j$ format where j is an integer number. The storing of one or more bits of data may include storing payload data and error check symbols as determined by the logic module 408 and described in more detail below.

The logic module 408 may be manufactured by forming a logic module configured to implement one or more algorithms (e.g., error correction codes such as finite field algebra codes, BCH code, Low Density Parity Check (LDPC), majority logic decodable codes, finite geometry codes, etc.). As described in more detail below, the logic module 408 may be configured to implement at least partially the one or more error correction codes when writing one or more bits of data into the memory cells 406.

The implementation of the error correction codes may include adjusting various aspects of error detection operations (e.g., the number of memory cells 406 needed for storing ECC data, including check symbols). The logic module 408 may also be configured to implement at least partially one or more error detection algorithms when reading one or more bits of data from the memory cell 406. The implementation may include detecting and correcting possible errors in read data as described in more detail below.

In an example embodiment, as shown in FIG. 4, the logic module 408 may be manufactured on the same chip as the memory array 404. In other example embodiments, the logic module 408 and the memory array 404 may be manufactured on separate chips in a multi-chip package. Specifically, in case of a complex logic module 408, it may be more prudent to use a general purpose IC process than a memory chip process to implement the logic module 408.

Figure 5:
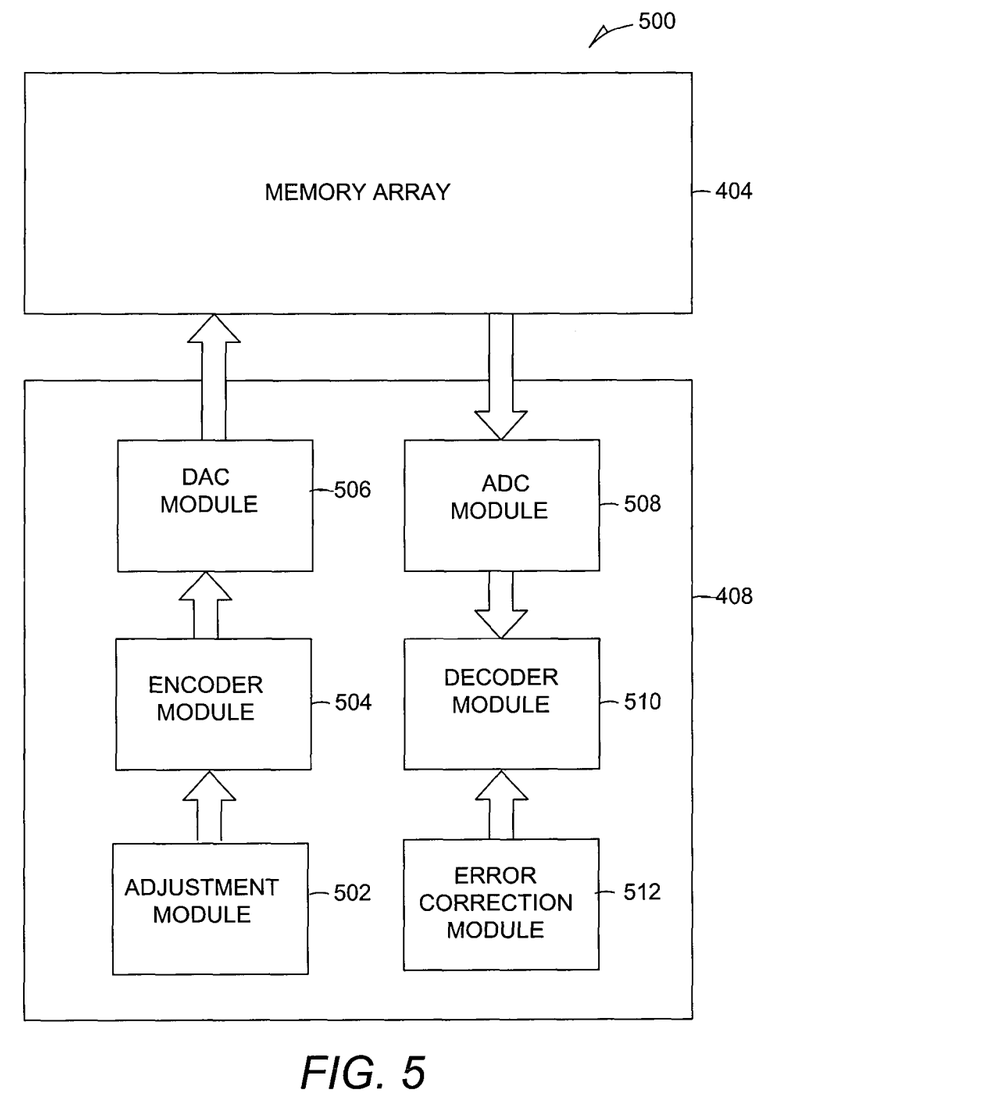
FIG. 5 is a diagram illustrating an example of modules of a logic module for error detection interfaced with a memory array comprising a multi-level memory cell, according to various embodiments of the invention.

For example, FIG. 5 is a diagram 500 illustrating an example of modules of the logic module 408 interfaced with the memory array 404, according to various embodiments of the invention. As shown in FIG. 5, the logic module 408 may include an adjustment module 502, an encoder module 504, a digital-to-analog converter (DAC) module 506, an analog-to-digital converter (ADC) module 508, a decoder module 510, and an error correction module 512. The logic module 408 may be implemented using logic gates or circuits to implement look-up tables, read only memory (ROM), RAM, or non-volatile memory to store look-up tables. In an example embodiment, the DAC and ADC may be part of the memory array 404.

In example embodiments, the functionality of the logic module 408 or its corresponding modules may be implemented using software comprising program modules that incorporate functionality of look up tables such as look up tables 710-770 shown in FIG. 7, described in more detail below. The software may be stored in computer memory, including DRAM or SRAM, or on one or more machine-readable media including non-volatile storage, such as a magnetic hard disk, an optical disk, or another form of storage for large amounts of data.

In an example embodiment, the adjustment module 502 may operate to adjust the ECC overhead (column 360) of Table 300. The ECC overhead is determined based on the number of error correction memory cells (e.g., the number of memory cells needed for ECC data in column 350 of Table 300) as shown above in describing FIG. 3 and discussed below using the flow diagram of FIG. 11. In some example embodiments, the adjustment module 502 may not be a part of the logic module 408.

The encoder module 504 may implement, at least partially, one or more error detection algorithms (e.g., ECC such as finite field algebra codes, BCH code, Low Density Parity Check (LDPC), majority logic decodable codes, finite geometry codes, etc.) to generate first encoded digital data including the one or more bits of data (e.g., payload data) and one or more check symbols to be stored in one or more memory cells such as memory cell 406, during a write operation. The finite field algebra codes may comprise systematic codes that generate coded data including verbatim copies of the payload data.

Examples of encoding data will now be discussed. However, the application is not limited to the systematic codes discussed below.

Figure 8:
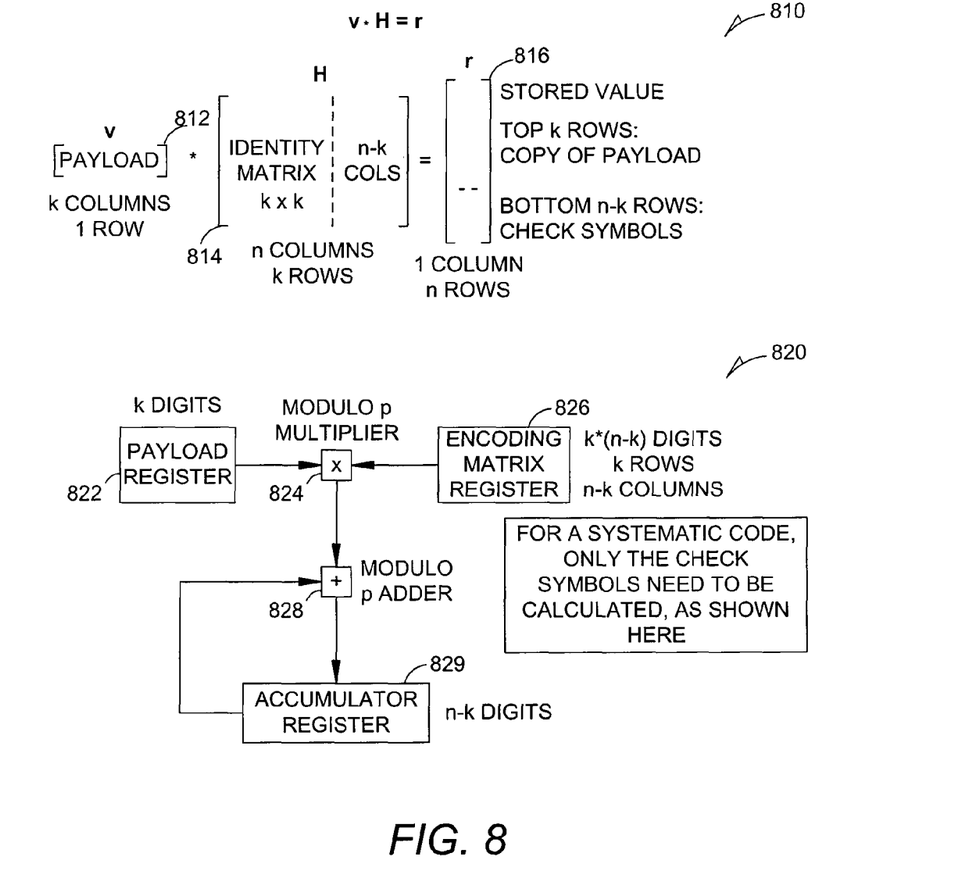
FIG. 8 is a diagram illustrating an example encoding of data to provide encoded data, according to various embodiments of the invention.

FIG. 8 is a diagram illustrating an example of encoding data to provide encoded data, according to various embodiments of the invention. Referring now to FIGS. 5 and 8, it can be seen that in an example embodiment, the encoder module 504 may use a BCH H matrix 814, as shown in operation 810, to encode the payload data (e.g., a payload vector 812) into a stored value vector 816. The H matrix 814 may, for example, comprise an n×k matrix comprising a k×k identity matrix and n−k columns including the check symbols. The result is first encoded digital data, (e.g., the stored value vector 816) comprising a copy of payload data in its top k rows and check sum symbols in its bottom n−k rows.

An example structure for the encoder module 504 is shown in block diagram 820 in FIG. 8. The payload register 822 may store the payload vector 812. The modulo-p multiplier 824 may perform the matrix multiplication operation 810 by multiplying the content of payload register 822 by the content of an encoding matrix register 826, which contains k*(n−k) digits. Examples of modulo-2 and modulo-3 addition and multiplications are shown in look-up tables 710, 720, 730, and 740 of FIG. 7, respectively. A modulo-p adder 828 and an n−k digit accumulator register 829 may operate on an output of the modulo-p multiplier 824 to accumulate the first encoded digital data (e.g., stored value vector 816) in the accumulator register 829.

In an example embodiment, the DAC module 506 may convert the first encoded digital data into a quantity that corresponds to a first number (e.g., 0, 1, 2, 3, 4, 5, 7, etc.), indicating a storage level of the memory cell 406 that is engaged during a write operation. The DAC module 506 may be designed according to methods known to those of ordinary skill in the art to satisfy design goals of the logic module 408. As part of the write operation of the memory array 404, the DAC module 506 may transfer the quantity to the memory array 404, where it may be stored in corresponding storage levels of one or more memory cells such as the memory cell 406.

According to example embodiments, in a successive read operation of the stored data from the memory array 404, the ADC (analog-to-digital converter) module 508 may convert a quantity corresponding to a second number of storage levels read from the memory cell (e.g., memory cell 406 of FIG. 4) into corresponding second encoded digital data. The quantity may, for example, include a voltage level associated with a storage level of the memory cell 406. In other example embodiments, the quantity may correspond to magnetic flux levels (e.g., in disk drives and ferro-electric memories), or the phase of a material (e.g., in phase change memories), etc.

Assuming no corruption of data occurs, the second encoded digital data read from the memory cell 406 would exactly match the first encoded digital data. The correctness of the read data may be determined by the decoder module 510. In an example embodiment, the decoder module 510 may implement, at least partially, at least one algorithm (e.g., ECC such as such as BCH algorithm, Low Density Parity Check (LDPC), majority logic decodable codes, finite geometry codes, etc.) to decode the second encoded digital data to retrieve one or more bits of read data (e.g., payload data) and one or more read check symbols and to verify the correctness of the one or more bits of read data based on the one or more read check symbols.

Figure 9:
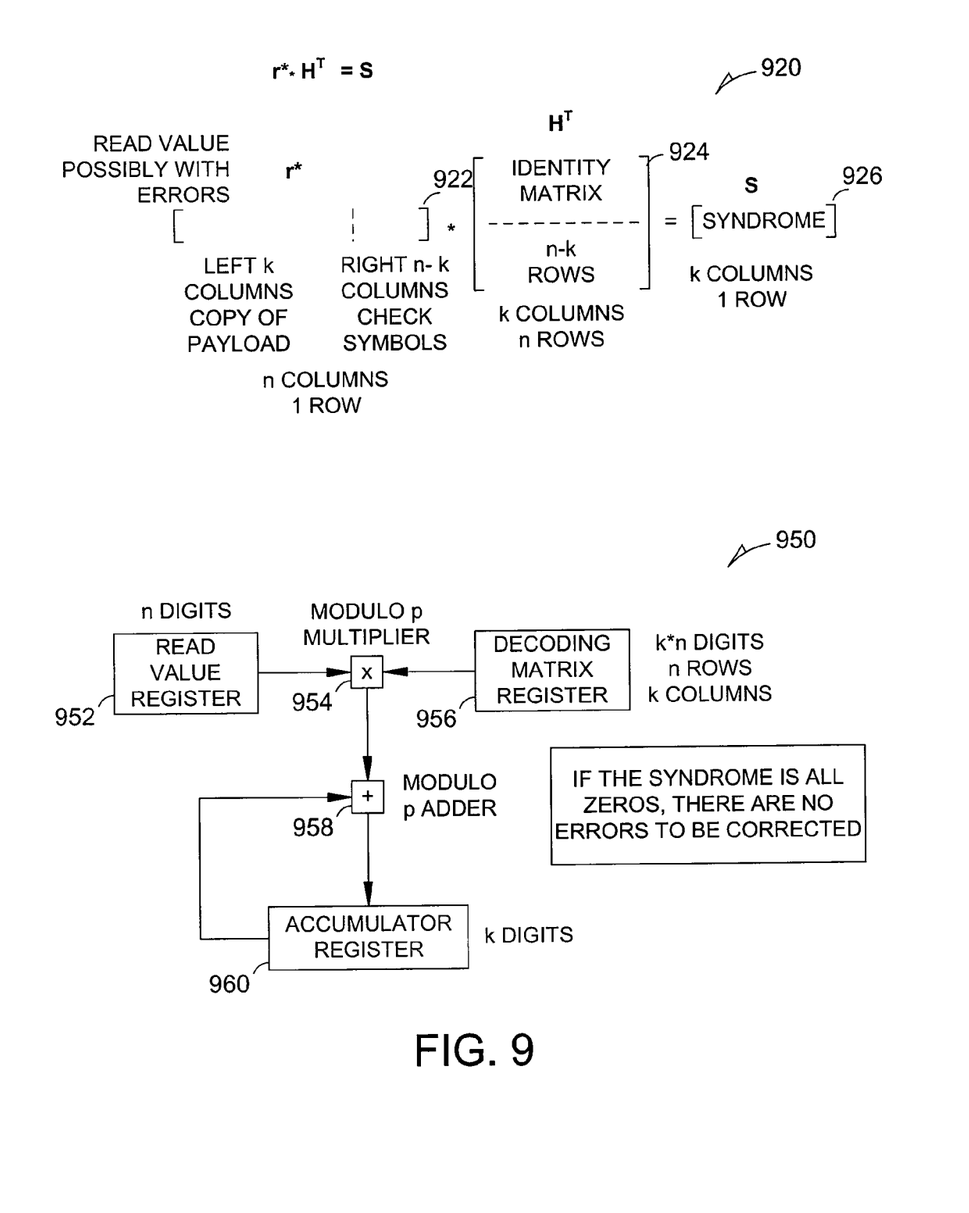
FIG. 9 is a diagram illustrating an example decoding of encoded data, according to various embodiments of the invention.

The decoder module 510 may use an $H^T$ matrix 924 of FIG. 9, which is a transpose of the H matrix 814 of FIG. 8, to recover a syndrome vector 926 by multiplying a read value vector 922 (e.g., the second encoded digital data) by the $H^T$ matrix 924. The matrix multiplication can be performed using modulo-p multiplication. The decoder module 510 may comprise a read value register 952, a modulo-p multiplier 954, a decoding matrix register 956, a modulo-p adder 958, and an accumulator register 960.

The read value register 952 and the decoding matrix register 956 may contain the read value vector 922 and the $H^T$ matrix 924, respectively. The content of the read value register 952 and the decoding matrix register 956 may be multiplied by the modulo-p multiplier 954, and the result may be processed by the modulo-p adder 958 and the accumulator register 960 to store the syndrome vector 926. The syndrome vector 926 contains a syndrome value comprising k digits. Using this mechanism, unless the syndrome value digits are all zero, there is an error to be corrected by the error correction module 512.

The error correction module 512 may implement, at least partially, one or more algorithms (e.g., ECC such as such as BCH algorithm, Low Density Parity Check (LDPC), majority logic decodable codes, finite geometry codes, etc.) to correct one or more incorrect bits of read data (e.g., payload data) read from a memory cell (e.g., the memory cell 406 of FIG. 4). In an example embodiment, the error correction module 512 may use the error correction procedure for the BCH algorithm.

Figure 10:
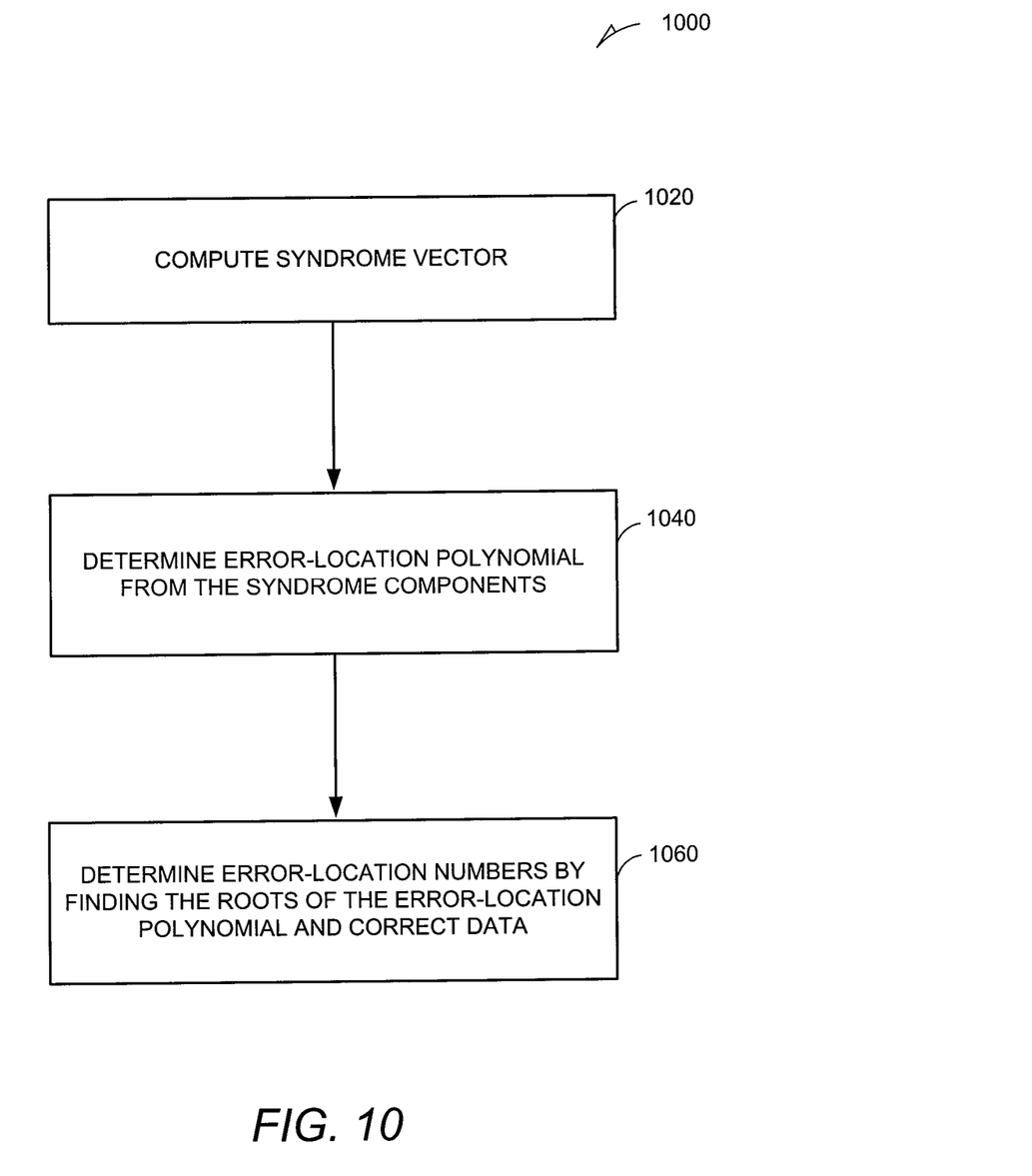
FIG. 10 is a flow diagram illustrating a method for error detection in multi-level memory cells, according to various embodiments of the invention.

For example, FIG. 10 is a flow diagram illustrating a method 1000 for error correction in multi-level memory cells, according to various embodiments of the invention. The method 1000 is high-level description of the procedure for the BCH algorithm. Interested readers are referred to Lin and Costello ("Error Control Coding: Fundamentals and Applications", by Shu Lin and Daniel J Costello, Prentice-Hall, Copyright 2004) for a more detailed discussion of the procedure, which is well known to those of ordinary skill in the art.

The method 1000 comprises three operations 1020, 1040, and 1060. However, each step may include a variety of sub-activities, which are not shown here.

At operation 1020, the syndrome vector 926 may be computed according to the method 920 of FIG. 9. The syndrome vector 926 may be a k component vector $S=(S_1, S_2, \ldots, S_k)$. The method 1000, at operation 1040, determines an error-location polynomial, from the syndrome vector 926, and follows through several iterations to find a minimum degree polynomial. If the degree of the minimum degree polynomial is greater than t (the acceptable number of errors, as shown in column 330 of Table 300), the error correction has failed due to too many errors. Otherwise, at operation 1060, roots of the error-location polynomial may be found. The roots of the error location polynomial may determine the error locations within the read value vector 922 of FIG. 9. Once the errors are located, they can be easily corrected by the error correction module 512.

Figure 6:
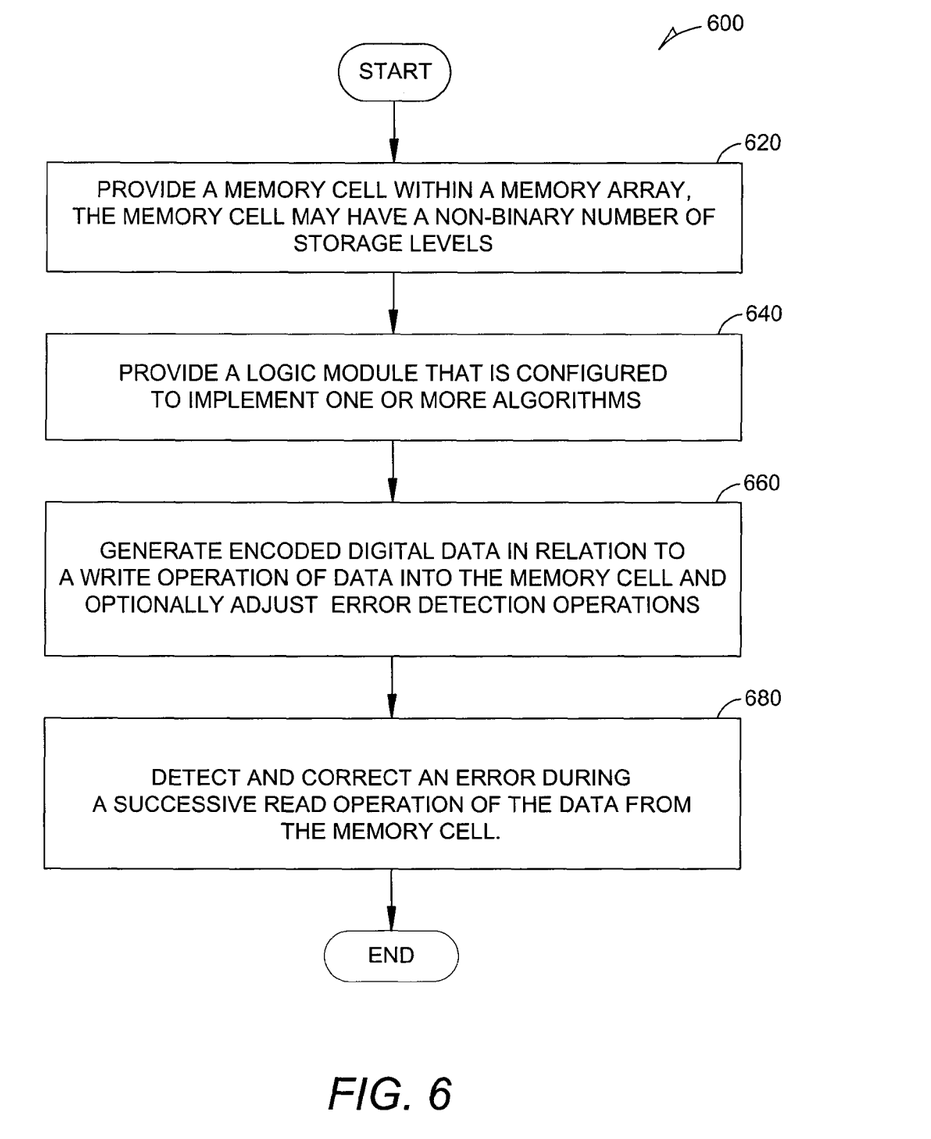
FIG. 6 is a flow diagram illustrating a method for integrating error detection with multi-level memory cells, according to various embodiments of the invention.

FIG. 6 is a flow diagram illustrating a method 600 for integrating error correction with multi-level memory cells, according to various embodiments of the invention. At operation 620, the memory cell 406 of FIG. 4 may be provided within the memory array 404 of FIG. 4.

The memory cell 406 may have one or more storage levels (e.g., voltage levels in FIG. 1). The number of the one or more storage levels may comprise a non-zero integer power of a non-binary prime number (e.g. 3, 5, 7, 9, etc.). At operation 640, a logic module (e.g., logic module 408) may be provided. The logic module 408 may be configured to implement one or more algorithms (e.g., ECC such as BCH algorithm, Low Density Parity Check (LDPC), majority logic decodable codes, finite geometry codes, etc.) to generate the first encoded digital data and decode the second encoded digital data.

In relation to a write operation of data into the memory cell 406, at operation 660, the logic module 408 may use the encoder module 504 to generate the encoded digital data. The logic module 408 may use the adjustment module 502 of FIG. 5 to adjust error correction operations as described in the flow diagram of FIG. 11, which will be discussed below. At operation 680, during a successive read operation of data from the memory cell 406, the logic module 408 may use the error correction module 512 of FIG. 5 to detect and correct possible errors in read data as described in FIGS. 8-10.

According to example embodiments, generating the encoded data may include generating first encoded digital data, including the data and one or more check symbols. The first encoded digital data may be converted, using the DAC module 506 of FIG. 5, into a quantity that indicates a storage level of the memory cell that is engaged during the write operation. Also, detecting and correcting possible errors may comprise converting, using the ADC module 508 of FIG. 5, a quantity corresponding to a second number of storage levels read from the memory cell, during the successive read operation, into corresponding second encoded digital data.

The method 600 may, for example, comprise using one or more algorithms to correct errors in data read from the memory cell, using the error correction module 512 of FIG. 5. The method 600 may further comprise adjusting an error correction algorithm (ECC) overhead, optionally using the adjustment module 502 of FIG. 5, wherein the ECC overhead is determined at least based on a number of error correction memory cells in column 350 of Table 300.

According to example embodiments, the logic module 408 modules such as the encoder module 504, the decoder module 510 and the error correction module 512 may be implemented using firmware or hardware. The modules 504, 510, and 512 may also be implemented using software comprising program modules that incorporate functionality of look up tables. Addition and multiplication in modulo-p arithmetic (e.g., modulo-3 arithmetic is applied where the number of storage levels is 3 or 9, as seen in Table 300 of FIG. 3), as used in finite field algebra, which is the basis for most error correction algorithms, such as BCH algorithms, may be implemented using look-up tables.

Figure 7:
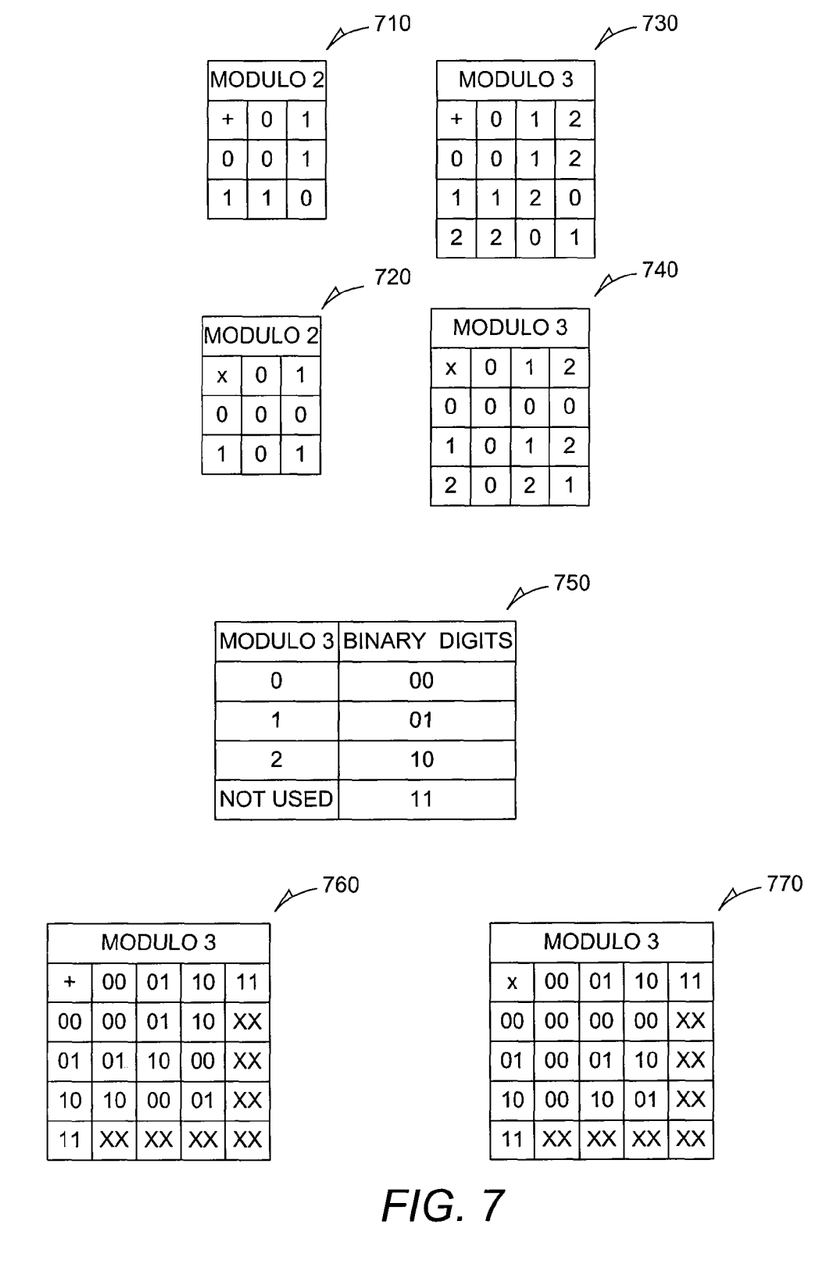
FIG. 7 shows look-up table examples illustrating single-digit modulo 2 and modulo 3 additions and multiplications, according to various embodiments of the invention.

For example, FIG. 7 shows look-up table examples illustrating single-digit modulo-2 and modulo-3 addition and multiplication operations, according to various embodiments of the invention. As seen from the modulo-2 addition and multiplication look-up tables 710 and 720, these operations can be equivalent to binary XOR and AND operations. The modulo-3 addition and multiplication operations may be represented by the look-up tables 730 and 740. In an example embodiment, the modulo-3 operations can be implemented with logic gates as well.

The modulo-3 look-up tables may be represented by pure binary digits after conversions made according to table 750. Applying the conversions shown in table 750 to the elements of the look-up tables 730 and 740 will result in the modulo-3 addition and multiplication look-up tables 760 and 770, where xx indicates that any value may be permitted, as the binary value 11 is not used in table 750.

Returning to FIG. 5, the optional adjustment module 502 may be configured to adjust the cost and performance of the memory array 404, by minimizing the ECC overhead (see Table 300 of FIG. 3) based on a desired level of reliability (i.e., defined by the value of AER). Reducing the ECC overhead may save die area (e.g., silicon chip area) used for realization of the memory array 404, which may result in production cost savings.

Figure 11:
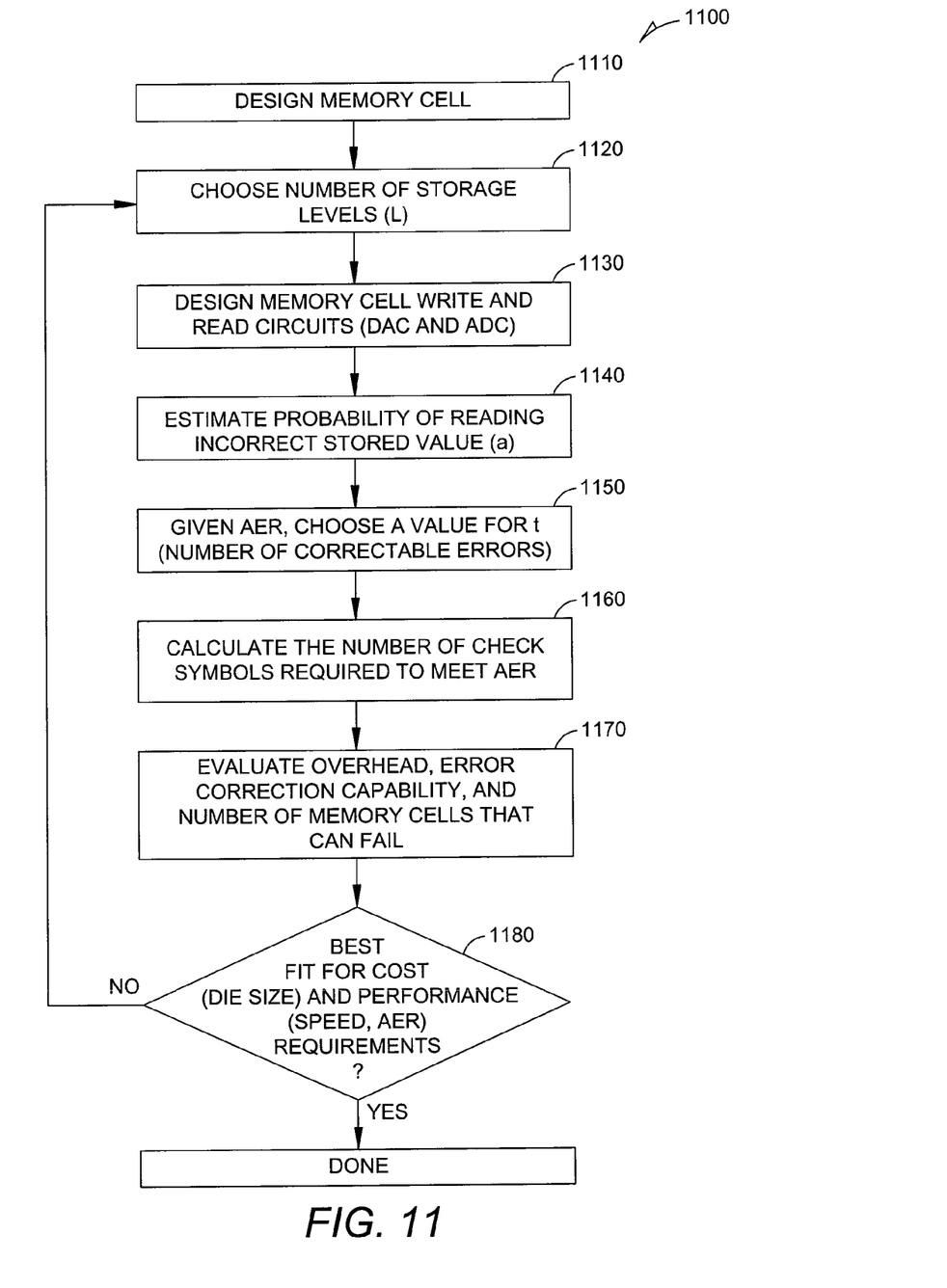
FIG. 11 is a flow diagram illustrating a method for adjusting cost and performance requirements of multi-level memory cells, according to various embodiments of the invention.

For example, FIG. 11 is a flow diagram illustrating a method 1100 for adjusting cost and performance requirements of multi-level memory cells, according to various embodiments of the invention. The memory cell design (e.g., design of memory cell 406 of FIG. 4) is the starting point (operation 1110) of the method 1100, where the adjustment imposes various design limitations. As a next step, the designer may, at operation 1120, choose an initial value for the number of storage levels (i.e., the number of voltage levels).

Based on the initial value for the number of storage levels, the designer may, at operation 1130, design the DAC and ADC modules 506 and 508 of FIG. 5. At operation 1140, knowing the process technology, a value for the probability of error for an individual memory cell, a, may be estimated (e.g., $10^{-9}$, as used in Table 300). Assuming a value for AER and using the estimated value for a and the formula presented above for AER(t), at operation 1150, the number of correctable errors, t, may be determined based on the initial value for the number of storage levels (see values of t in column 330 of Table 300 in FIG. 3, for different values of numbers of storage levels in column 310).

The number of check symbols (e.g., (n−k) in FIG. 9) may be calculated, at operation 1160, based on BCH methods, by multiplying the value of t by m (m as in the GF($p^m$) representation of the finite field used). For example, if the initial value for the number of storage levels is 7, then the finite field used, GF($7^5$), as shown in column 340 of Table 300, would suggest a value of 5 for m. The corresponding value of t from Table 300 is 5. Therefore, the number of check symbols that meets the assumed AER would be: m*t=25. At operation 1170, the ECC overhead (as shown in column 360 of Table 300) may be calculated based on the number of cells needed for ECC data (column 350 of Table 300) and the number of payload cells (as shown in column 320 of Table 300). The number of memory cells that can fail depends on the error correction capability t and the number of storage levels per cell 310.

At decision block 1180, if the memory array design specifications, in terms of cost (die size) and performance (e.g., speed and AER requirements) are not met, control is passed to the operation 1120, where a new value for the number of storage levels is selected and the method 1100 is continued based on that value. Otherwise, the number of check symbols and the value for ECC overhead are final and the method is complete.

Embodiments of a method and circuit for integrating error correction with multi-level memory cells have been described. Although the present embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
   adjusting an error detection operation in relation to a write operation of data into a multi-level memory cell, wherein an error correction code (ECC) overhead value is adjusted based on a number of error correction memory cells; and
   detecting a possible error in read data during a successive read operation of the data from the multi-level memory cell.

2. The method of claim 1, wherein the multi-level memory cell includes storage levels, and wherein each of the storage levels includes at least one of a voltage level, magnetic flux level, or a phase of a material.

3. The method of claim 1, wherein a number of storage levels in the multi-level memory cell being a non-binary number, and wherein a base-p logarithm of the number of the storage levels comprises an integer greater than zero where p is a prime number other than 2.

4. The method of claim 1, wherein detecting the possible error comprises detecting the possible error using at least one code, the at least one code comprising at least one of a finite field algebra code, a BCH (Bose, Ray-Chaudhuri, and Hocquenghem) code, a LDPC (low density parity check) code, a majority logic decodable code, or a geometry code.

5. The method of claim 1, further comprising:
   generating encoded digital data including the data and one or more check symbols; and
   converting the encoded digital data into a quantity that indicates storage levels of the memory cell that is engaged during the write operation.

6. The method of claim 1, wherein detecting the possible error comprises:
   converting a quantity corresponding to a number of storage levels read from the multi-level memory cell, during the successive read operation, into corresponding encoded digital data.

7. The method of claim 6, further comprising:
   decoding the encoded digital data to retrieve read data and one or more read check symbols and verifying correctness of the read data based on the one or more read check symbols; and
   using at least one code to correct an error in the read data from the memory cell.

8. A memory device comprising:
   a memory cell within a memory array to store a number of bits of data, the number of bits of data being determined by a non-binary number of storage levels in the memory cell; and
   an adjustment module to adjust an error correction code (ECC) overhead value based on a number of error correction memory cells.

9. The memory device of claim 8, wherein the memory array comprises:
an analog-to-digital converter (ADC) module to convert an encoded digital data into a quantity that indicates storage levels of the memory cell that is engaged during a write operation; and
a digital-to-analog converter (DAC) module to convert a quantity corresponding to a number of storage levels read from the memory cell, during a successive read operation, into corresponding the encoded digital data.

10. The memory device of claim 8, wherein the adjustment module is integrated with the memory array in at least one of a single die, a multi-die package, or a multi-package die.

11. The memory device of claim 8, wherein the adjustment module is within a logic module, and wherein the logic module is configured to detect and correct errors in read data.

12. The memory device of claim 11, wherein the logic module comprises circuits including at least one of logic gates to implement look-up tables, read only memory (ROM), random Access memory (RAM), or nonvolatile memory to store look-up tables.

13. The memory device of claim 11, wherein the logic module is configured to implement at least one of a finite field algebra code, a BCH (Bose, Ray-Chaudhuri, and Hocquenghem) code, a LDPC (low density parity check) code, a majority logic decodable code, or a geometry code, and wherein the finite field algebra code comprises a systematic code that generates coded data including a verbatim copy of payload data.

14. The memory device of claim 11, wherein the logic module comprises:
an encoder module to generate encoded digital data including the one or more bits of data and one or more check symbols; and
an analog-to-digital converter (ADC) module to convert the encoded digital data into a quantity that indicates storage levels of the memory cell that is engaged during the write operation.

15. The memory device of claim 11, wherein the logic module comprises:
a digital-to-analog converter (DAC) module to convert a quantity corresponding to a number of storage levels read from the memory cell, during the successive read operation, into corresponding encoded digital data; and
a decoder module to decode the encoded digital data to retrieve one or more bits of read data and one or more read check symbols and to verify correctness of the one or more bits of read data based on the one or more read check symbols.

16. The memory device of claim 11, wherein the logic module comprises:
an error correction module to implement, at least partially, at least one error detection and correction algorithm to correct one or more errors in data read from the memory cell.

17. Memory comprising:
an analog to digital converter (ADC) module to convert a quantity read from a plurality of memory cells of memory into encoded digital data including one or more read bits of data and one or more read check symbols in a successive read operation;
an error correction module to detect a possible error in one or more bits of read data based on the read check symbols and to correct the possible error using a code; and
an adjustment module to adjust an error correction code (ECC) overhead value, wherein the ECC overhead value is at least partially determined based on a number of error correction memory cells.

18. The memory of claim 17, comprising:
a decoder module to decode the encoded digital data to retrieve the one or more bits of read data and the one or more read check symbols.

19. A module comprising:
an analog to digital converter (ADC) module to convert a quantity read from a memory cell into encoded digital data including one or more bits of read data and one or more read check symbols in a successive read operation;
an error correction module to detect a possible error in the one or more bits of read data based on the read check symbols and to correct the possible error using a code; and
an adjustment module to adjust an error correction code (ECC) overhead value, wherein the ECC overhead value is determined at least based on a number of error correction memory cells.

20. The module of claim 19, further comprising:
an encoder module to generate first encoded digital data based on the one or more bits of data and one or more check symbols; and
a digital-to-analog converter (DAC) module to convert the first encoded digital data into a corresponding quantity to be stored into the memory cell in a write operation, the memory cell having a non-binary number of storage levels.

* * * * *